(12) United States Patent
Kolan et al.

(10) Patent No.: US 8,399,985 B2
(45) Date of Patent: *Mar. 19, 2013

(54) MOLD DESIGN AND SEMICONDUCTOR PACKAGE

(75) Inventors: Ravi Kanth Kolan, Singapore (SG); Hao Liu, Singapore (SG); Chin Hock Toh, Singapore (SG)

(73) Assignee: United Test And Assembly Center Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/244,630

(22) Filed: Sep. 25, 2011

(65) Prior Publication Data

US 2012/0018869 A1    Jan. 26, 2012

Related U.S. Application Data

(63) Continuation of application No. 12/125,924, filed on May 23, 2008, now Pat. No. 8,030,761.

(60) Provisional application No. 60/939,621, filed on May 23, 2007.

(51) Int. Cl.
*H01L 23/36* (2006.01)

(52) U.S. Cl. ......... 257/713; 257/E23.101; 257/E21.505; 438/122

(58) Field of Classification Search .................. 257/713, 257/E23.101, E21.505
See application file for complete search history.

(56) References Cited

U.S. PATENT DOCUMENTS

| | | | | |
|---|---|---|---|---|
| 6,060,340 | A * | 5/2000 | Chou | 438/110 |
| 6,157,080 | A | 12/2000 | Tamaki et al. | |
| 6,316,291 | B1 | 11/2001 | Weber | |
| 6,767,753 | B2 | 7/2004 | Huang | |
| 7,247,509 | B2 | 7/2007 | Yamauchi et al. | |
| 7,598,617 | B2 | 10/2009 | Lee et al. | |
| 7,728,440 | B2 * | 6/2010 | Honda | 257/778 |
| 2001/0017408 | A1 * | 8/2001 | Baba | 257/713 |
| 2005/0121757 | A1 * | 6/2005 | Gealer | 257/678 |

* cited by examiner

*Primary Examiner* — Matthew W Such
*Assistant Examiner* — Krista Soderholm
(74) *Attorney, Agent, or Firm* — Horizon IP Pte Ltd

(57) ABSTRACT

A chip package includes a carrier having a first and a second major surface. The first major surface includes an active region surrounded by an inactive region. The chip package includes contact pads in the active region for mating with chip contacts of a chip. A support structure is disposed on the inactive region of the first major surface. The support structure forms a dam that surrounds the active region. When a chip or chip stack is mounted in the active region, spacing exists between the dam and the chip or chip stack. The spacing creates convention paths for heat dissipation.

20 Claims, 6 Drawing Sheets

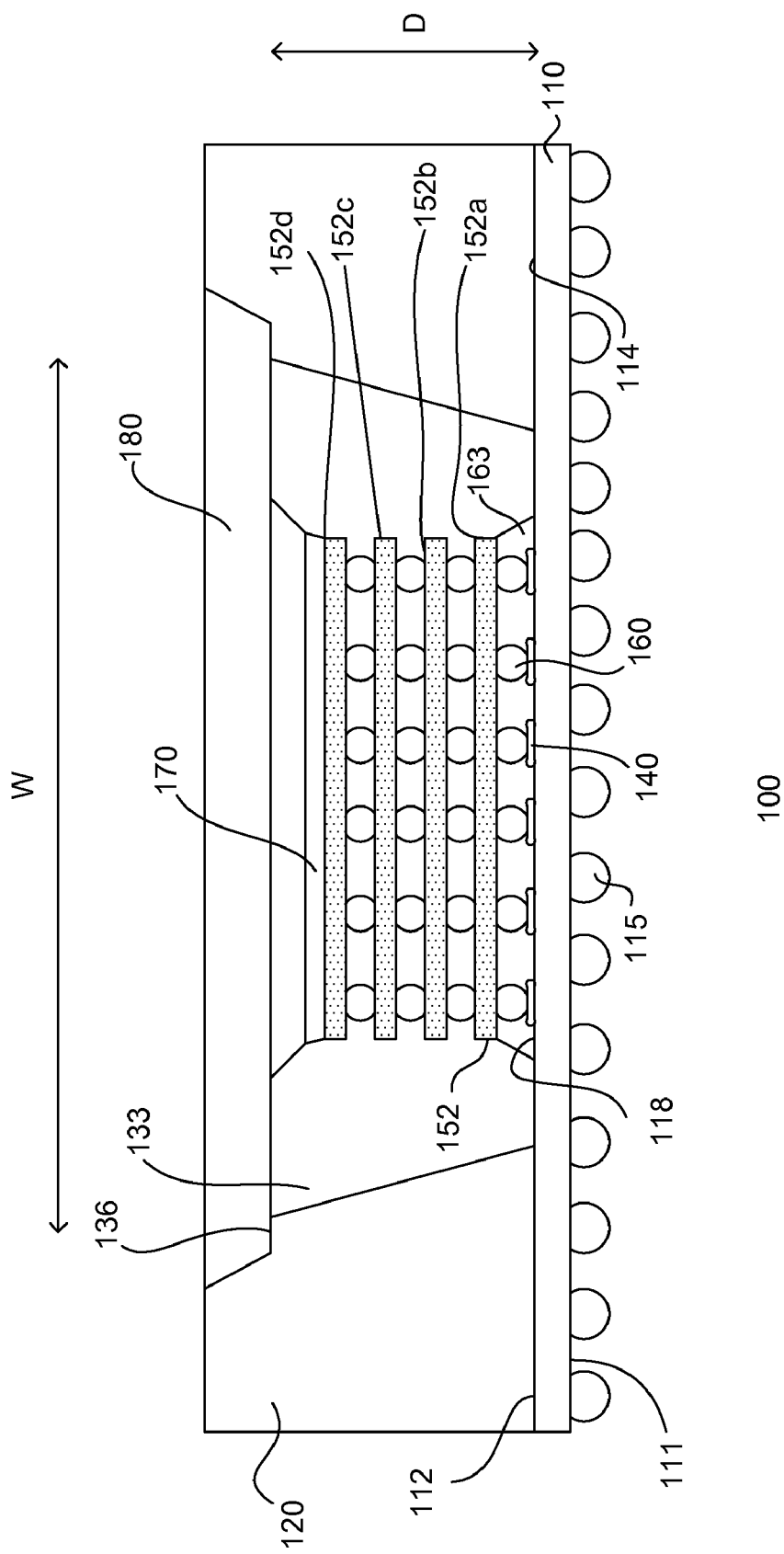

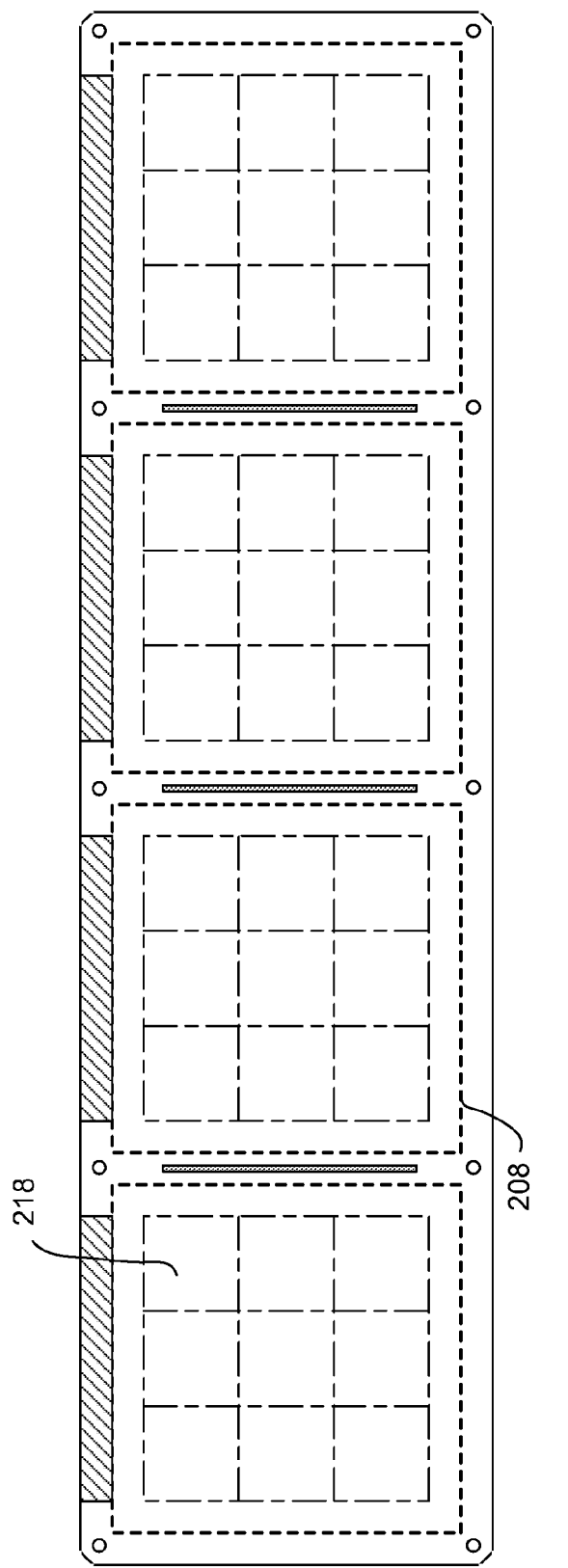

MOLD DESIGN AND SEMICONDUCTOR PACKAGE

CROSS-REFERENCE TO RELATED APPLICATIONS

This application is a continuation application of co-pending U.S. patent application Ser. No. 12/125,924 filed May 23, 2008, which claims priority to U.S. patent application Ser. No. 60/939,621 filed May 23, 2007. These applications are hereby incorporated by reference in their entireties.

BACKGROUND

Miniaturization of portable consumer products such as MP3 players, mobile phones, digital camera are driving the need for smaller size packages with high memory density and more functionality. In response to the above-mentioned requirements, 3D style packages are preferred due to their shorter electrical connections. 3D packaging can be achieved with, for example, Through Silicon Via (TSV) technology which is applicable to wafer-to-wafer stacking or chip-to-wafer staking However, reflow is required for the devices at each stack level and the reflow equation is "n" times reflow for "n" stacked package. For example, three times of reflow are necessary if three devices are stacked on top of an interposer substrate.

Conventional stacking process involves repeated handling of thin wafer. Since the thin wafers are delicate, the repeated handling of such wafers increases the potential for cracking, incurring high yield loss are of high possibility. Moreover, conventional methods used for forming stacked package encounter major thermal challenges as the existence of thermal hot spots might drastically affect the functionality of the device. Additionally, expensive equipment is needed to achieve wafer-to-wafer or chip-to-wafer stacking From the foregoing discussion, it is desirable to produce high thermal performance semiconductor package with low production cost and improved throughput. It is also desirable to produce semiconductor packages using existing assembly equipment and yet provides a robust thermally enhanced stacked semiconductor packaging.

SUMMARY

Embodiments relate generally to chip packages. Other types of applications can also be useful. In one embodiment, a chip package is disclosed. The chip package comprises a carrier having a first and a second major surface. The first major surface comprises an active region surrounded by an inactive region. The chip package includes contact pads in the active region for mating with chip contacts of a chip. A support structure is disposed on the inactive region of the first major surface, wherein the support structure forms a dam surrounding the active region. When a chip or chip stack is mounted in the active region, spacing exists between the dam and the chip or chip stack. The spacing creates convection paths to dissipate heat.

In an alternate embodiment, an integrated circuit (IC) package is presented. The IC package further includes a chip stack that includes a plurality of chips mounted in the active region and spacing around the chip or chip stack between the dam and the chip stack. The spacing creates convection paths for heat dissipation.

In another embodiment, a method of packing is disclosed. The method includes providing a carrier and providing a support structure on top of the carrier to define a cavity exposing a bonding area of the carrier. The bonding area includes contact pads. The support structure provides spacing between the support structure and a chip stack when mounted to the bonding area in the cavity to create convection paths to dissipate heat.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1 shows a semiconductor package in accordance with one embodiment of the invention; and FIGS. 2a-e show a method of forming a semiconductor package in accordance with one embodiment of the invention.

DETAILED DESCRIPTION

Figure 2B:
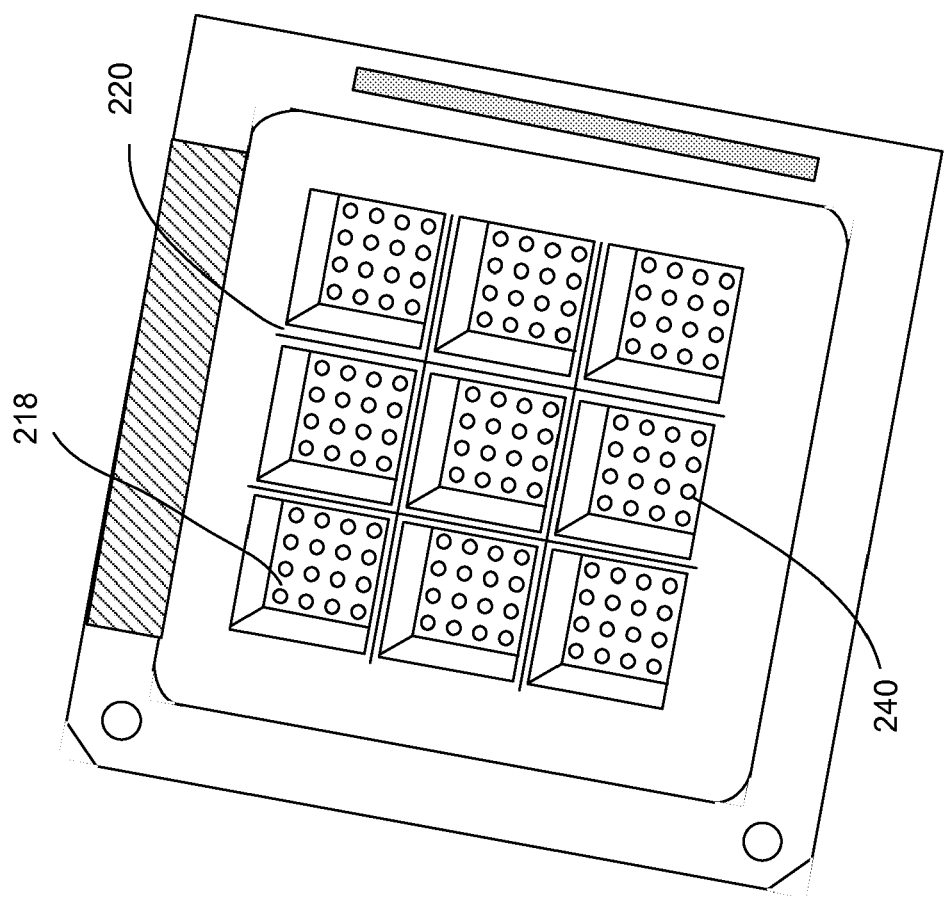

Embodiments relate generally to chip packages. Other types of applications can also be useful. Various types of chips or ICs can be packaged. For example, the IC can be a memory device such as a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices. The ICs can be incorporated into various products, such as phones, computers, personal digital assistants or other types of suitable products.

FIG. 1 shows cross-sectional view of an embodiment of a chip package 100. The chip package includes a carrier or package substrate 110 with bottom and top major surfaces 111 and 112. The carrier, for example, can be a single or multi-layered laminate substrate. Package contacts 115 are disposed on one of the major surfaces. The surface on which the contacts are located is, for example, referred to as the bottom surface. The package contacts can comprise spherical shaped structures or balls arranged in a grid pattern to form a BGA. The balls, for example, comprise solder. Various types of solders can be used, such as lead-based, non lead-based alloys or conductive polymers. Arranging the contacts in other patterns or providing other types of contacts are also useful.

Contact pads 140 are provided on the other or top surface of the carrier. The contact pads, for example, comprise bump pads. The bump pads may comprise gold, solder, nickel, copper or combinations thereof. Other types of conductive materials may also be useful. Solder paste can be provided on the contact pads. The contact pads, for example, are disposed in an active region 118 of the carrier. The contact pads are interconnected to the package contacts on the bottom surface of the carrier.

A chip 152 can be mounted on the package. In one embodiment, chip contacts 160 of a chip are mated to the contact pads. The chip contacts, for example, comprise contact bumps formed on a surface of the chip. The contact bumps, for example, comprise solder. Various types of solders can be used, such as lead-based, non lead-based alloys or conductive polymers.

The package can be used to mount a single chip or a chip stack having n number of chips, where n is ≧1. As shown, the chip stack comprises 4 chips (n=4), i.e. 152*a*, 152*b*, 152*c* and 152*d*. Providing other values of n for the chip stack is also useful. In the case of a chip stack, the chips, for example, comprises bumped through silicon via (TSV) chip. A TSV chip comprises contact pads on a top surface and contact bumps on a bottom surface. The chip at the bottom of the stack (e.g., n=1) is coupled to the contact pads in the active region. As for the other chips, they are coupled to contact pads located on the top surface of the chip below. For example, contacts of the $n^{th}$ chip are coupled to contact pads of the n−1 chip. The chips of the chip stack can be of the same type and same size. Providing a chip stack having chips which are different types of sizes are also useful. As for the chip at the top of the stack, it can be a TSV or other types of chips. For example, the top chip can be a flip chip.

To secure the chip for assembly, various techniques can be employed. For example, the chip can be secured using tape, such as adhesive or conductive tape. Alternatively, flux can be provided on the bumps of the chip to temporarily hold the chip in place for assembly. In one embodiment, an underfill 163, such as epoxy, can be provided in the cavity formed in between the chip and the substrate to encapsulate and protect the conductive bumps. The underfill serves to reduce thermal stress between the bumps and contact pads, improving reliability. The underfill should at least fill the space between the chip and the carrier, completely encasing the bumps. In one embodiment, the underfill fills the cavity. Various techniques can be used to provide the underfill in the cavity. The underfill, for example, can be needle-dispensed along the edges of the chip and drawn into the space between the chip and carrier by capillary action and cured to form a permanent bond. Other techniques for applying the underfill are also useful.

A support structure 120 is provided on the carrier. The support structure, for example, comprises a dam. In one embodiment, the dam is disposed in an inactive region 114 of the carrier. The dam, for example, surrounds the active region, leaving the contact pads in the active region exposed. The dam creates a cavity 133 around the active region. In one embodiment, the dimension of the cavity is sufficient to accommodate a chip or chip stack. For example, the width (W) of the cavity is larger than the chip or chip stack and the depth (D) is greater than the height of the chip or chip stack.

In one embodiment, D is sufficient to accommodate a lid 180. For example, the upper portion of the dam can be provided with a recess or step 136 to accommodate the lid. Alternatively, the lid is attached to the top of the dam. Other configurations of mounting the lid to the dam are also useful. The lid can be a thermal conductive member such as a thermal lid for dissipating heat generated by the chip(s). The thermal lid can be formed from a thermal conductive material. Other types of thermal conductive members are also useful. Thermal grease 170 can be provided between the chip surface and the thermal lid to improve thermal conduction from the chip (s) to the lid.

As shown, inner sidewalls of the dam which form the cavity comprise a slanted profile. Providing other sidewall profiles is also useful. For example, the sidewall profile can be vertical or stepped. Stepped profiles, for example, can be used to accommodate chip stacks having different sizes. Additionally, stepped profiles can be used to provide support to a bottom portion of the chip.

The dam, in one embodiment, comprises a mold compound or other types of plastic materials. Other types of materials can also be used. The dam may also be pre-formed before mounting onto the carrier. The width of the dam should be sufficient to provide mechanical stability to the package.

The dam can enhance heat dissipation. For example, the space between the dam and stacked chips acts as convection paths to conduct heat away from the chips.

In another embodiment, the space between the stacked chips and the dam may be filled with a thermal dissipating material such as a phase change material or thermal gel. Providing thermal dissipating materials advantageously conducts heat away from the stacked chips to improve thermal dissipation performance.

FIGS. 2*a-e* show an embodiment of a method of packaging, for example, a semiconductor device or integrated circuit. Referring to FIG. 2*a*, a carrier 218 is provided. In one embodiment, the carrier comprises a laminate substrate. Typically, the laminate substrate comprises glass fibers impregnated with a resin material such as BT (bismaleimide triazine), polyimide resin or other organic resins. The carrier can alternatively comprise a copper frame. Other types of materials or substrates are also useful.

The carrier can be prepared to include package contacts (not shown) disposed on one of the major surfaces. The surface on which the contacts are located is, for example, referred to as the bottom surface. The package contacts can comprise spherical shaped structures or balls arranged in a grid pattern to form a BGA. The balls, for example, comprise solder. Various types of solders can be used, such as lead-based, non lead-based alloys or conductive polymers. Arranging the contacts in other patterns or providing other types of contacts are also useful.

Contact pads 240 as shown in FIG. 2*b*, are provided on the other or top surface of the carrier. The contact pads, for example, comprise bump pads. Solder paste can be provided on the contact pads. The contact pads, for example, are disposed in an active or bonding region of the carrier which is surrounded by an inactive region. The contact pads are interconnected to the package contacts on the bottom surface of the carrier.

The carrier, for example, is part of a carrier strip 200 comprising a plurality of carrier arrays 208. As shown, the carrier strip comprises 4 carrier arrays, each having 9 carriers arranged in a 3×3 matrix. Other numbers of carrier arrays (including 1) or array sizes are also useful. The carrier strip facilitates parallel assembling of chip packages.

Referring to FIG. 2*b*, a 3×3 carrier array is shown. In one embodiment, a support structure 220 is disposed on the carrier array. The support structure comprises a pattern which forms dams or supports on the inactive regions of the carriers, resulting in contact pads in the active regions 218 being exposed. As shown, a support structure is provided for a carrier array. Other configurations of support structures are also useful. For example, an individual support structure can be provided for each carrier, a support structure for the carrier strip or other configurations is also useful.

The support structure can be prefabricated or premolded and subsequently mounted onto the carrier array. The support structure, for example, can be mounted using an adhesive. Alignment marks or features can be provided to ensure correct alignment of the support structure to the carrier. For example, the alignment marks or features are provided on the carrier and support structure. Other techniques for aligning the support structure to the carrier are also useful. Alternatively, the support structure is provided on the carrier by molding. For example, a mold having top and bottom chases can be provided, with the carrier placed onto the bottom chase and the top chase having the pattern of the support structure. Other techniques of providing the support structure can also be useful.

Figure 2C:
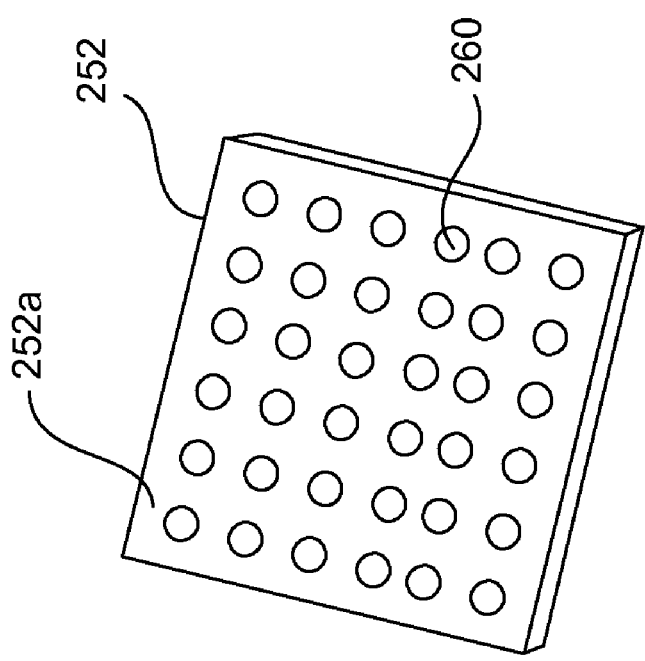

FIG. 2c shows a semiconductor die or chip 252 which will be mounted to the bonding area of the carrier. In one embodiment, the chip includes an active or bottom surface 252a on which conductive bumps 260 are formed. The conductive bumps, for example, form a pattern which matches the pad pattern in the bonding region of the carrier. Through vias can be provided in chip which are connected to the bumps and extend to a top surface of the chip, forming a bumped through silicon via (TSV) chip. Other types of chips are also useful. Like the bumps, the through vias form a pattern on the top surface of the chip.

Figure 2D:
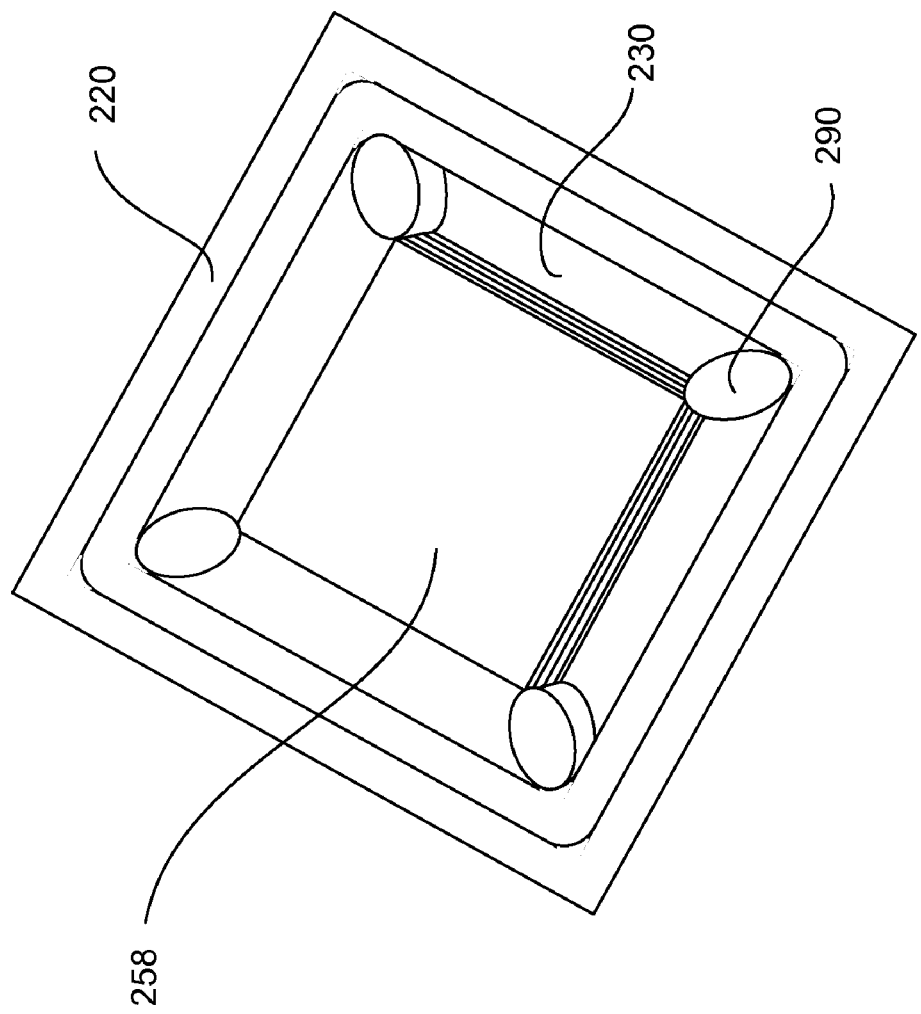

The process continues, as shown in FIG. 2d. In one embodiment, a first chip is mounted in the bonding region of the carrier. Mounting the chip can be achieved by pick and place techniques. Prior to mounting the chip, the bumps are covered with a flux. For example, the chip is picked, dipped into a flux to cover the bumps and placed into the bonding region. The flux causes the bumps to be tacky, temporarily holding the chip in place in the bonding region.

After the first chip is held in place, a second chip is mounted on the top surface of the first chip. For example, the second chip is picked, dipped into flux, and placed in alignment with the pads on the top surface of the first chip. The process of picking, dipping and placing repeats n number of times to form a chip stack 258 with n number of chips.

After the chip stack is formed, the carrier is heated to reflow the bumps of the chips, The reflow causes the bumps of the chips to flow and bond to the pads. The reflow temperature should be below the temperature which causes the package balls to reflow. The reflow is conducted, for example, at a temperature of about 250-300° C. Other reflow temperatures are also useful. The reflow is performed to simultaneously bond all the chips of the stack together.

In one embodiment, chip stabilizers are provided after the chip stack has been reflowed. The chip stabilizers, for example, comprise epoxy. The epoxy may be dispensed using a needle dispenser. As shown in FIG. 2d, chip stabilizers 290 are provided at the corners of the dam, holding the chip in place. Locating the chip stabilizers at other parts of the dam can also be useful. Chip stabilizers advantageously provide mechanical stability to the chip stack in the package.

An underfill (not shown), such as epoxy, can be provided to fill the cavity formed in between the chip and the substrate to encapsulate and protect the conductive bumps. The underfill can improve reliability as it reduces the thermal stress between the bumps and contact pads. Various techniques can be used to provide the underfill in the cavity. The underfill, for example, can be needle-dispensed along the edges of the chip and drawn into the space between the chip and carrier by capillary action and cured to form a permanent bond. Alternatively, moldable underfill can be used. Other techniques for applying the underfill can also be useful.

A thermal conductive member, for example, a heat sink or a thermal gel or lid can be provided subsequently on top of the chip or chip stack. The periphery of the thermal conductive member can be attached to the step of the dam without requiring adhesive. The stepped sidewall profile of the dam serves as a support that holds the thermal conductive member securely in place during assembly. Furthermore, by being able to hold the thermal conductive member securely in place during assembly, yield, reliability and thermal performance are enhanced.

In one embodiment, the space 230 between the stacked chips and the support structure may be filled with a thermal dissipating material such as a phase change material or thermal gel. For example, prior to attaching the lid, the thermal dissipating material is dispensed to fill the space between the stacked chips and support structure. Providing thermal dissipating materials advantageously conducts heat away from the stacked chips and improves thermal dissipation performance.

As discussed, the use of a carrier strip comprising a plurality of arrays facilitates parallel assembly of the packages. The assembly can be performed in various sequences. For example, chips are stacked one carrier at a time and one array at a time. Other sequences, such as providing a chip in each carrier of the array before the next chip is stacked. Assembling the packages using other sequences is also useful.

Figure 2E:
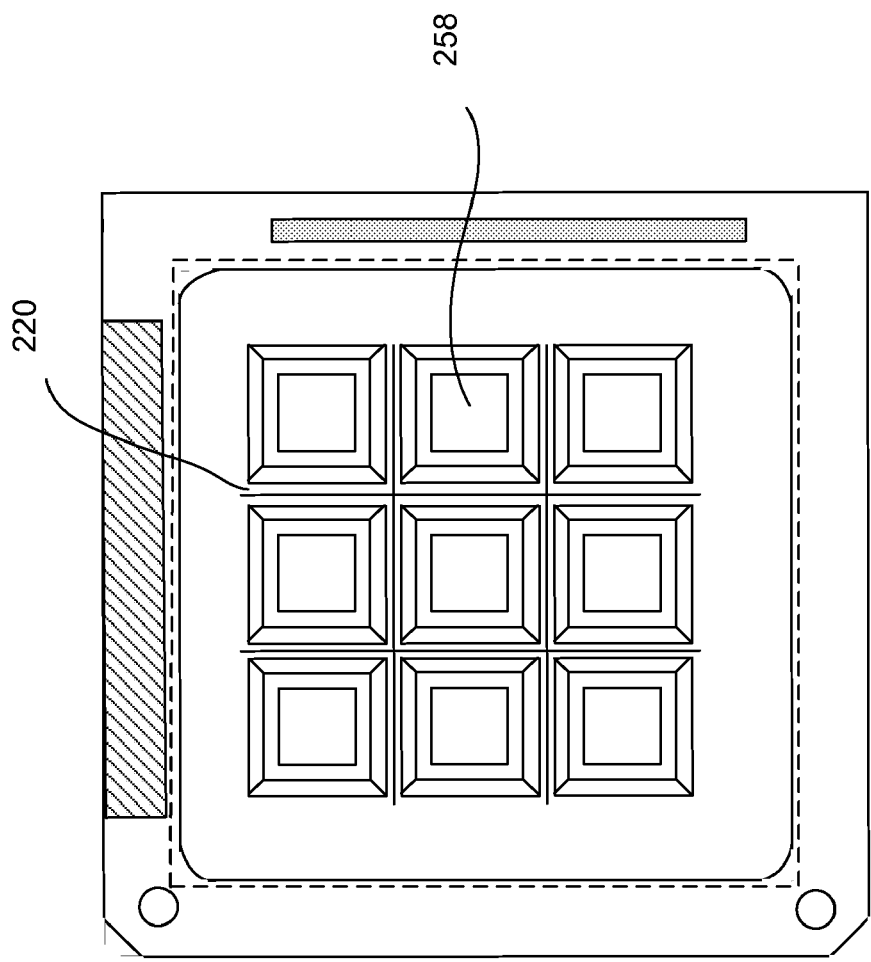

FIG. 2e shows a carrier array having chip stacks. The process continues by cutting the carrier array into a plurality of single package units.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A chip package comprising:
   a carrier having a first and a second major surface, wherein the first major surface comprises an active region surrounded by an inactive region;
   contact pads in the active region for mating with chip contacts of a chip;
   a support structure disposed on the inactive region of the first major surface, wherein
      the support structure forms a dam surrounding the active region, and
      inner sidewalls of the dam comprise a stepped profile; and
   when a chip or a chip stack is mounted in the active region, spacing exists between the dam and the chip or chip stack, wherein the spacing creates convection paths to dissipate heat; and
   at least one chip stabilizer in the spacing, wherein the chip stabilizer contacts the chip or chip stack and dam to stabilize the chip or chip stack without completely filling the spacing to maintain the convection paths to dissipate heat.

2. The chip package of claim 1 wherein an upper portion of the inner sidewalls of the dam is provided with a step for accommodating a lid.

3. The chip package of claim 2 comprises when a chip or chip stack is mounted:
   a lid being attached to a step of the stepped profile of the dam covering the spacing and chip or chip stack.

4. The chip package of claim 1 wherein the inner sidewalls of the dam comprise a slanted profile.

5. The chip package of claim 4 wherein the dam includes a top surface and a bottom surface which is wider than the top surface and the bottom surface of the dam is disposed on the inactive region of the carrier.

6. The chip package of claim 1 further comprises a chip being mounted in the active region.

7. The chip package of claim 1 further comprises a chip stack comprising n number of chips disposed in the active region.

8. The chip package of claim 7 wherein the chip stack is arranged such that
a $n^{th}$ chip is stacked on top of a $n^{th}-1$ chip, and
contacts of the $n^{th}$ chip are coupled to contact pads on a top surface of the $n^{th}-1$ chip.

9. The chip package of claim 1 includes a plurality of chip stabilizers, wherein the chip stabilizers are disposed in the spacing at corners of the dam and chip or chip stack.

10. A method of packaging comprising:
providing a carrier having a first and a second major surface, wherein the first major surface comprises an active region surrounded by an inactive region;
providing contact pads in the active region for mating with chip contacts of a chip;
providing a support structure on the inactive region of the first major surface, wherein the support structure forms a dam surrounding the active region, the inner sidewalls of the dam comprise a stepped profile and provides spacing around a chip between the dam and the chip to create convection paths to dissipate heat when the chip is mounted in the active region; and
providing at least one chip stabilizer in the spacing, wherein the chip stabilizer contacts the chip and dam to stabilize the chip without completely filling the spacing to maintain the convection paths to dissipate heat.

11. The method of claim 10 further comprises providing a chip in the active region.

12. The method of claim 10 further comprises forming a chip stack having n number of chips in the active region.

13. The method of claim 12 wherein forming the chip stack includes:
stacking a $n^{th}$ chip on top of a $n^{th}-1$ chip; and
contacts of the $n^{th}$ chip are coupled to contact pads on a top surface of the $n^{th}-1$ chip.

14. The method of claim 10 wherein the inner sidewalls of the dam comprise a slanted profile.

15. The method of claim 14 wherein the dam includes a top surface and a bottom surface which is wider than the top surface and the bottom surface of the dam is provided on the inactive region of the carrier.

16. A chip package comprising:
a carrier having a first and a second major surface, wherein the first major surface comprises an active region surrounded by an inactive region;
contact pads in the active region for mating with chip contacts of a chip;
a support structure disposed on the inactive region of the first major surface, wherein the support structure forms a dam surrounding the active region, wherein
inner sidewalls of the dam comprise a slanted profile,
a bottom surface of the dam is wider than a top surface of the dam, and the bottom surface of the dam is disposed on the inactive region of the carrier; and
when a chip or a chip stack is mounted in the active region, spacing exists between the dam and the chip or chip stack, wherein the spacing creates convection paths to dissipate heat.

17. The chip package of claim 16 comprises at least one chip stabilizer in the spacing, wherein the chip stabilizer contacts the chip or chip stack and dam to stabilize the chip or chip stack without completely filling the spacing to maintain the convection paths to dissipate heat.

18. The chip package of claim 16 further comprises a chip being mounted in the active region.

19. The chip package of claim 16 further comprises a chip stack comprising n number of chips disposed in the active region.

20. The chip package of claim 16 wherein the inner sidewalls of the dam comprise a stepped profile.

* * * * *